US006784771B1

(12) United States Patent
Fan

(10) Patent No.: US 6,784,771 B1
(45) Date of Patent: Aug. 31, 2004

(54) MEMS OPTICAL MIRROR ARRAY

(75) Inventor: Long-Sheng Fan, San Jose, CA (US)

(73) Assignee: New Peregrine, Inc., San Jose, CA (US)

( * ) Notice: Subject to any disclaimer, the term of this patent is extended or adjusted under 35 U.S.C. 154(b) by 0 days.

(21) Appl. No.: 10/202,995

(22) Filed: Jul. 24, 2002

Related U.S. Application Data

(60) Provisional application No. 60/307,736, filed on Jul. 24, 2001.

(51) Int. Cl.[7] ............................................. H01H 51/22
(52) U.S. Cl. ......................... 335/78; 361/233; 359/224; 359/877; 359/361; 359/233
(58) Field of Search ........................... 335/78; 310/309; 359/223–4, 877, 224; 361/233; 200/181

(56) References Cited

U.S. PATENT DOCUMENTS

| | | | | |
|---|---|---|---|---|
| 6,265,239 B1 | * | 7/2001 | Aksyuk et al. | ............... 438/52 |
| 6,509,670 B2 | * | 1/2003 | Jeong et al. | ................ 310/309 |
| 6,522,445 B1 | * | 2/2003 | Kleytman | ................... 359/224 |
| 6,587,408 B1 | * | 7/2003 | Jacobson et al. | ........ 369/44.16 |

OTHER PUBLICATIONS

Lin, L. Y., Goldstein, E.L., Takach, R.W., "Free–Space Micromachined Optical Switches for Optical Networking", IEEE Journal of Selected Topics in Quantum Electronics, vol. 5, No. 1, Jan./Feb. 1999.

Ford, Joseph E., Aksyuk, Vladimir A., Bishop, David J. and Walker, James A., "Wavelength Add–Drop Switching Using Tilting Micromirrors", Journal of Lightwave Technology, vol. 17, No. 5, May 1999.

* cited by examiner

Primary Examiner—Lincoln Donovan
(74) Attorney, Agent, or Firm—Van Pelt & Yi

(57) ABSTRACT

A compact high aspect ratio MEMS optical switch, and a process for fabricating same, are disclosed. An outer body portion is mounted so as to have a first rotational degree of freedom about a first axis. An inner body portion is coupled mechanically to the outer body portion so as to have a second rotational degree of freedom relative to the outer body portion about a second axis, the second axis being substantially perpendicular to the first axis and in the plane of the outer body portion. The inner body portion is further coupled to the outer body portion in a manner such that the inner body portion rotates with the outer body portion about the first axis if the outer body is rotated about the first axis, such that the second axis remains substantially in the plane of the outer body portion as the outer body portion rotates about the first axis. An outer electrostatic actuator is configured to rotate the outer body portion about the first axis when an electrostatic force is applied to the outer electrostatic actuator. An inner electrostatic actuator is configured to rotate the inner body portion relative to the outer portion about the second axis when an electrostatic force is applied to the inner electrostatic actuator. The outer body portion, inner body portion, outer electrostatic actuator, and inner electrostatic actuator are formed in just two structural layers. In one embodiment, the inner body portion comprises a metal substrate on which a metal payload, such as an optical mirror, is formed.

23 Claims, 4 Drawing Sheets

MEMS OPTICAL MIRROR ARRAY

CROSS REFERENCE TO RELATED APPLICATIONS

This application claims priority to U.S. Provisional Patent Application No. 60/307,736 entitled COMPACT, HIGH-ASPECT-RATIO MEMS OPTICAL STEERING MIRROR ARRAY DEVICE, SUBSYSTEM filed Jul. 24, 2001, which is incorporated herein by reference for all purposes.

FIELD OF THE INVENTION

The present invention relates generally to micro-electro-mechanical systems (MEMS). More specifically, a compact high aspect ratio MEMS device is disclosed.

BACKGROUND OF THE INVENTION

MEMS optical mirror arrays have a variety of applications. A two-dimensional MEMS scanning mirror array may be used as an optical switch, for image projection, or for other applications in which a two-dimensional MEMS optical mirror array may be useful. Optical switches, for example, are the essential part of a DWDM (dense wavelength division multiplexing) optical network, and MEMS (micro-electro-mechanical system) optical switches provide a transparent, scalable, compact, low-cost, high performance solution. For MEMS optical switches, two general approaches are the binary 2-D switches and the analog 3-D switches. The 3-D approach has better scalability; however, the structure and control are more complicated. Gimbals of 2-degrees of freedom (typically for out-of-plane rotational motions) are needed for MEMS 3-D switches.

Device Issues: Electrostatic actuation devices are commonly used in MEMS because of the simplicity of this approach. Parallel plate, interdigitated and some hybrid designs are used for these actuators. Interdigitated electrode actuators have the advantage of small starting voltage and position-independent driving force, which is easier to control. To implement interdigitated electrode structures for an out-of-plane motion requires two electrode layers in a surface MEMS process. Motion in another out-of-plane orthogonal direction can cause undesirable electrostatic force components, contact of opposite electrodes and short circuit. To implement another out-of-plane motion, additional layers are needed. The layers should be adequately thick for the required output force generated by the electrodes, structure stiffness and robustness. Also, the payload (e.g., mirror) is typically a fraction of a millimeter in lateral size and a few degrees of out-of-plane rotational motion will induce a few tens of micrometer vertical motion at the edges. In addition, for purposes of electrical efficiency it typically is necessary to have small gaps between the electrodes to increase the torque output by providing high field intensity (everything else being the same), with the result that the electrodes are closer together and more likely to short circuit or come in contact. Thus, the implementation using interdigitated electrodes will require a multiple-layer high-aspect-ratio MEMS structures.

Process technology restriction: Surface micro-machining, bulk micro-machining and their combinations are used to implement MEMS 3-D switches. Bulk micro-machining can produce high-aspect ratio structures; however, their capability to implement multiple layers is limited. Surface micro-machining can produce multiple-layer structures; however, their structure thickness-to-width aspect ratio and feature resolution are generally limited, except in a LIGA-like process. (LIGA is an acronym in German meaning lithography electroplating and molding.) These high-aspect ratio surface micro-machining processes developed recently have for the most part been restricted to single layer applications. The fabrication of surface MEMS with high-aspect ratio layers requires minimizing the number of layers to be more manufacturable.

Optical system issue: For application in an optical networking system, the MEMS chip for mirror arrays and each beam-steering mirror in the array needs to be of a certain size decided by the optical path length and tolerable insertion loss, etc. The optical path is in turn decided by the port count (number of mirrors and their pitch) and actuator scanning ranges. If the overall optical system size can be scaled down, the optical path is short and the beam size of the gaussian beam from a single-mode fiber at the location of the steering mirror can be small. This allows the mirror to be made small, which in turn means the array can be more compact with the result that the optical path can be shorter. A large mirror with a small mirror pitch (large fill factor) thus gives the best system performance. The other requirement is that the optical signals need to be equalized in the DWDM system to minimize errors and processing times at the detection end.

Therefore, there is a need for a MEMS optical switch that meets the device, process, and optical system criteria described above.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, or a system. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

A 3-D electrostatic MEMS switch with only two structure layers for the electrodes and two out-of-plane gimbals, and a process for making same, are disclosed.

Figure 1:
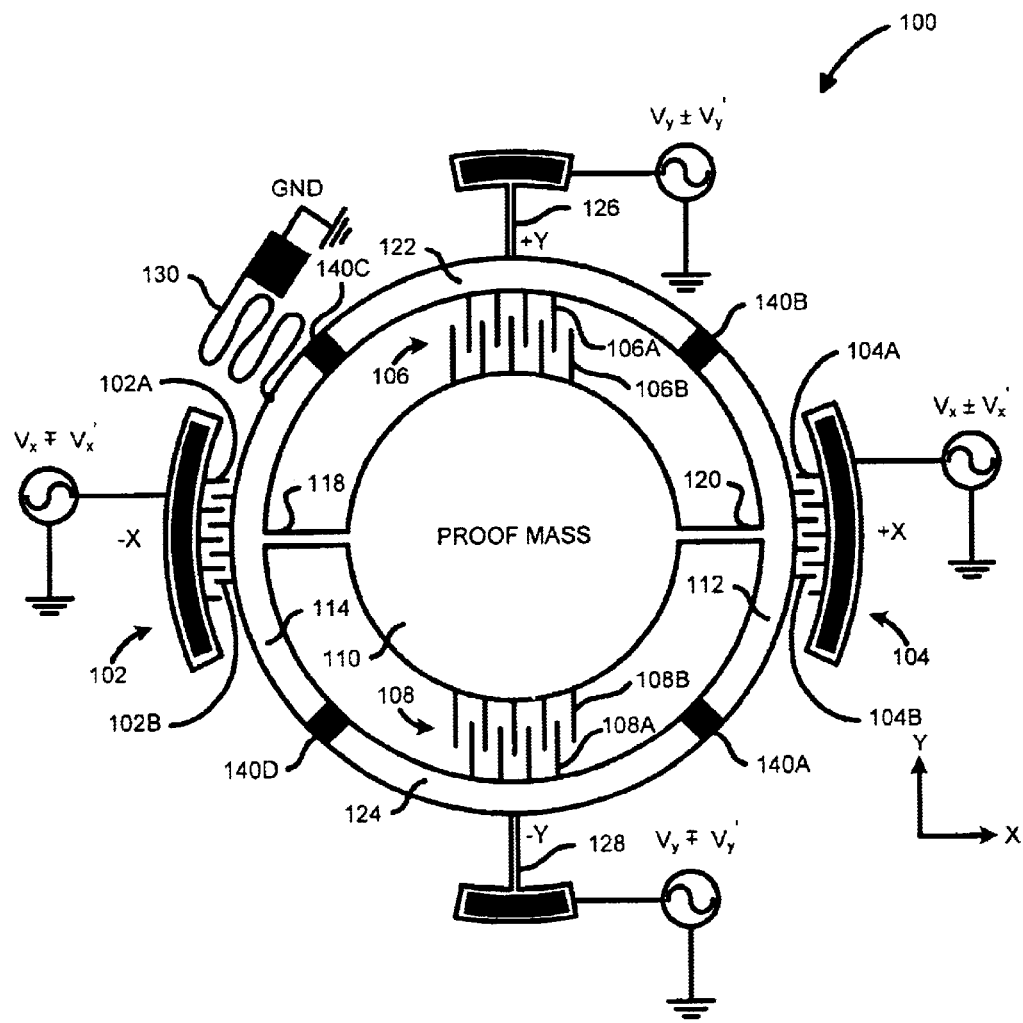
FIG. 1 shows a MEMS version of an electrostatic actuation device 100 capable of two degrees of freedom in out-of-plane rotational motions.

FIG. 1 shows a MEMS version of an electrostatic actuation device 100 capable of two degrees of freedom in out-of-plane rotational motions. As seen in FIG. 1, four sets of interdigitated electrodes 102 (labeled −x), 104 (labeled +x), 106 (labeled −y), and 108 (labeled −y) with their respective gimbals are used to obtain rotational motions along the y and x axes. We define the "driving electrodes" as the group of electrodes in each set that is connected to driver circuits, and the "driven electrodes" as the group of electrodes in each set that is connected to the payload to be rotated. The driven electrodes are preferably electrically grounded. For example, electrode set 102 comprises a group of driving electrodes 102a and a group of driven electrodes 102b. Similarly, electrode sets 104, 106, and 108 each comprise a group of driving electrodes (104a, 106a, and 108a, respectively) and a group of driven electrodes (104b, 106b, and 108b, respectively). Since the sets of electrodes 106 and 108, which are positioned along the y-axis and control rotation about the x-axis, are connected to the inside main body to be moved, they are referred to herein as the "inner electrodes". The electrode sets 102 and 104, which are positioned on the x-axis and provide rotational motion about the y-axis, are referred to herein as the "outer electrodes". The body 110, to which the driven electrodes are attached, is constrained by two torsional springs at each rotational axis in the in-plane, orthogonal direction. Two sets of torsional springs—a first set comprised of springs 118 and 120 and a second set comprised of springs 126 and 128—are used for two out-of-plane degrees of freedom.

The electrodes 102, 104, 106, and 108 are made out of conducting material such as metal alloys or semiconductors. Each of the groups of driving electrodes 102a, 104a, 106a, and 108a is offset from the corresponding group of driven electrodes 102b, 104b, 106b, and 108b in the out-of-plane z-direction. Each electrode has a thickness ranging from a few micrometers ($\mu$m) to one hundred micrometers depending on the desired range of motion. For example, to rotate a 500 $\mu$m structure in the out-of-plane direction for an angle of a few degrees requires tens of micrometers of displacement at the edges. The electrodes will need to move through a similar range and continuously generate torque within this range of motion; therefore, the electrode thickness will be in the tens of micrometers in this particular case.

To have a large mechanical output derived from electromechanical actuation, the variation of stored energy vs. variation of motion must be large. Large stored electrostatic energy is typically achieved by applying a large volume of strong field, which is easy to achieve with small gaps. The lateral resolution of the electrodes is typically from a fraction of a micrometer to tens of micrometers. A process technology to produce such structures with the aspect ratio (in thickness to resolution ratio) of 10:1 or above is described below.

If the body 110 were rotated about the y-axis by operation of electrode sets 102 and 104, and if driving electrodes 106a and 108a were stationary, the driven electrodes 106b and 108b each would be tilted against its corresponding driving electrodes 106a and 108a, respectively. For a small angle of rotation and a small control voltage less than the "pull-in" voltage of the affected electrode set, this tilting might be tolerable; however, this should be avoided in a general case where large rotation and large control voltage between the electrodes might produce physical contacts and short circuit. To avoid contacts of the driving electrodes and driven electrodes of the same set during motions in the orthogonal directions, in one embodiment the inner set of driving electrodes 106a and 108a (in+/−y direction for rotations along x-axis) are also made movable together with the inner driven electrodes 106b and 108b, as shown in FIG. 1. Thus, y-axis driving electrodes 106a and 108a are mounted on lower ring portions 122 and 124, respectively, which are connected electrically to a driving voltage through torsional springs 126 and 128, respectively. Torsional springs 126 and 128 are separated from the substrate (not shown). Lower ring portions 122 and 124 are coupled mechanically to upper ring portions 112 and 114 at overlap regions 140a–140d, as shown in FIG. 1, but are electrically isolated from upper ring portions 112 and 114, as described more fully below. A relatively soft flexure spring 130 with a tailored spring constant is electrically connected to upper ring portion 114, which in turn is connected electrically to the center body 110 through torsional spring 118, to provide a way to connect the groups of driven electrodes 102b, 104b, 106b, and 108b to ground.

In one embodiment, the electrostatic actuation device 100 is used in a 3-D electrostatic MEMS optical switch. In one embodiment, a mirror suitable for use in such a switch is formed on center body 110. In one embodiment, the mirror is formed by depositing a suitable metal, such as gold (Ag), on center body 110, using techniques known in the art. In another embodiment, a short post and a mirror substrate are formed on top of the center body 110, using the sub-module process described below, before depositing the mirror coating. In one embodiment, the substrate on which the mirror is formed, which may be the center body 110 or a substrate formed thereon, as described above, comprises a suitable metal structure. In one such embodiment, forming a metal mirror on such a metal mirror substrate is advantageous because the thermal characteristics of the substrate more closely match those of the mirror itself. In certain embodiments and applications, such matching or more near matching of thermal characteristics may avoid problems that may otherwise have resulted from curvature or other consequences of having unmatched thermal properties, such as if the heat generated by light hitting the mirror causes the mirror substrate to expand at a rate different than that of the mirror itself.

Figure 2:
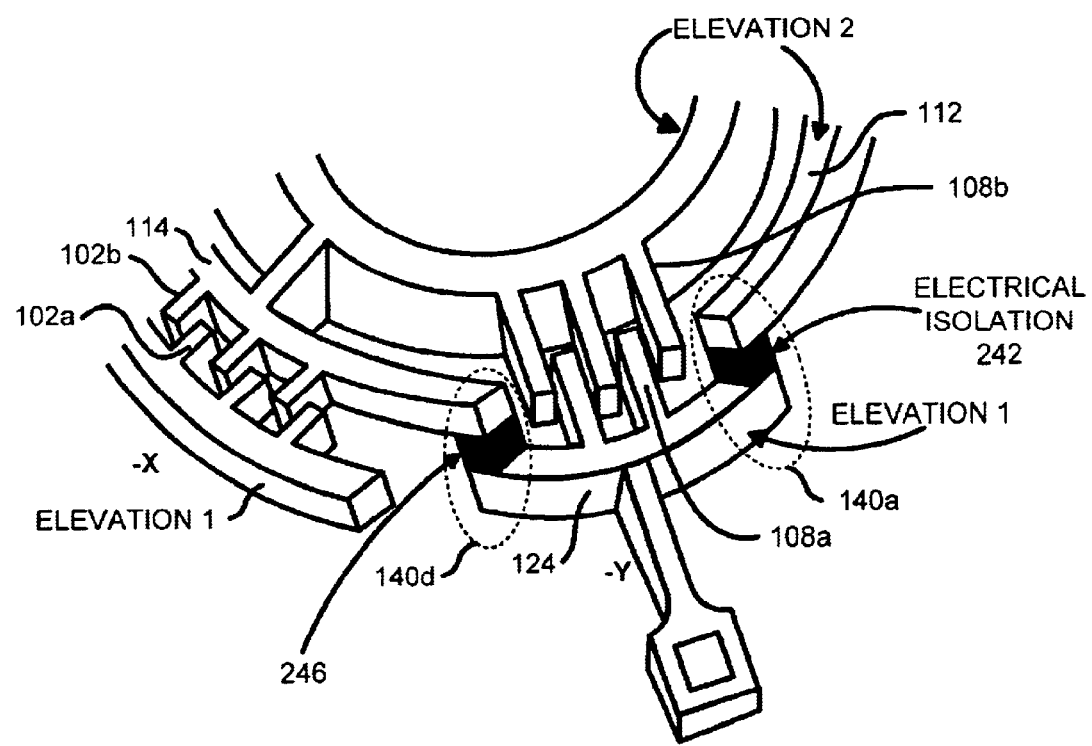
FIG. 2 is a partial perspective view of the electrostatic actuation device 100 shown in FIG. 1.

It should be noted that although FIGS. 1 and 2 show circular structures rectangles or other appropriate shapes may also be used.

FIG. 2 is a partial perspective view of the electrostatic actuation device 100 shown in FIG. 1. An electrical isolation layer 242 is shown to isolate the y-axis driving electrodes 108a (attached to lower ring portion 124) electrically from with the x-axis driven electrodes 104b (not shown in FIG. 2, but shown in FIG. 1 as being attached to upper ring portion 112). Some examples of the thin-film material that may be used to form electrical isolation layer 242 are silicon nitride, aluminum oxide, or cured polyimide, etc. Alternatively, these can be reverse-biased PN junctions if semiconductor material is used as the structure layers. Likewise, electrical isolation layer 246 is used in overlap region 140d to isolate lower ring portion 124 electrically from upper ring portion 114, thereby isolating y-axis driving electrodes 108a from x-axis driven electrodes 102b. Corresponding structures are employed at overlap regions 140b and 140c.

Figure 3A:
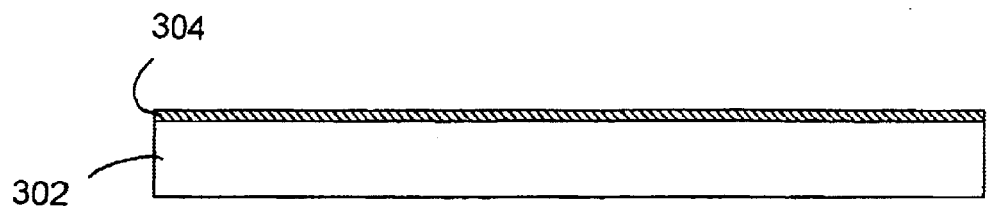
FIGS. 3A–G outline a process used in one embodiment to fabricate an electrostatic actuation device such as described above.
Figure 3B:
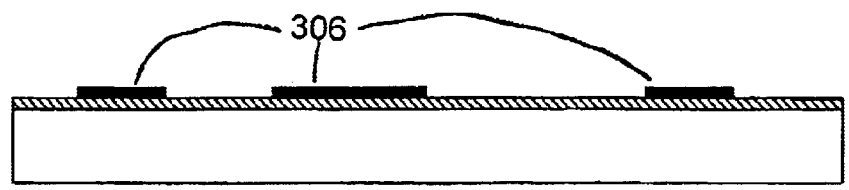
Figure 3C:
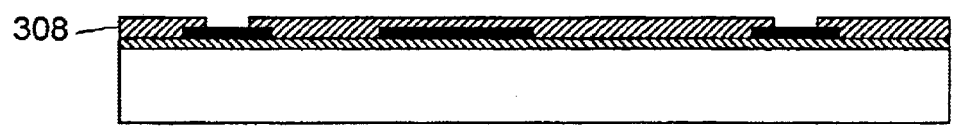

FIGS. 3A–G outline a process used in one embodiment to fabricate an electrostatic actuation device such as described above. Referring first to FIG. 3A, the process begins with a substrate 302, which is typically a silicon substrate that may already have some passivated circuit integrated on it. An insulation layer 304 such as PECVD silicon nitride or polyimide is deposited and patterned on the substrate. Next, as shown in FIG. 3B, an interconnect layer 306 (conducting metals) for grouping the electrodes is deposited and patterned. Referring next to FIG. 3C, another insulating layer 308 of aluminum oxide or polyimide of a few micrometers is deposited and patterned.

Figure 3D:
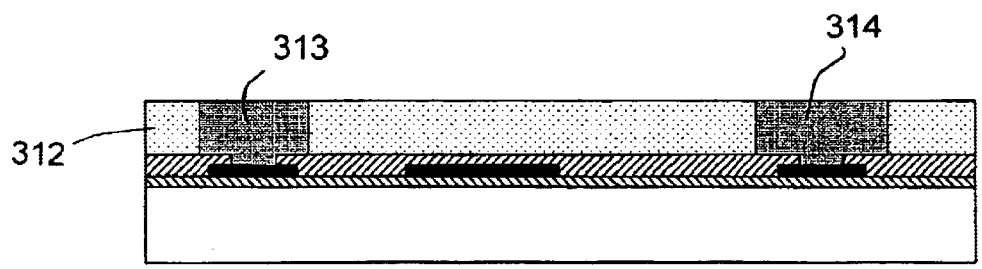

Referring to FIG. 3D, a proper seed layer (not shown) such as Cr/Cu of a few hundred angstroms is sputtered. The use and application of such seed layers is well known in the art and essentially comprises depositing a thin conductive layer to provide a conductive path for a subsequent electroplating process. Next, a thick layer (on the order of tens of micrometer) of polymer 312 is deposited and patterned on top of the seed layer, after which the structure is electroplated to form lower electrode base structures 313 and 314. Various metal compositions can be deposited in this way such as nickel, Invar, Permalloy, copper etc. The polymer patterning can be done using photosensitive polymer or an image transfer process by dry etching (photoresist, photosensitive polyimide, SU8, etc.)

Figure 3E:
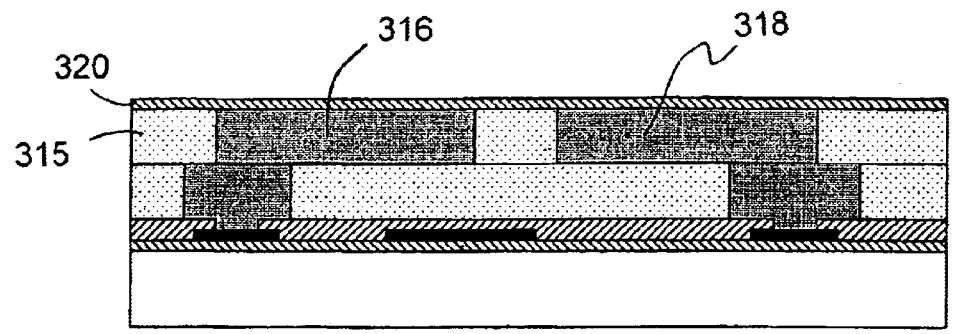

The structure shown in FIG. 3D is planarized by either RIE (reactive ion etching) or lapping/CMP (chemical mechanical polishing) before another seed layer (not shown) is sputter deposited. Referring to FIG. 3E, a thick layer of polymer 315 is deposited and patterned on top of the seed layer, then the structure is electroplated to form lower electrodes 316 and 318. A dielectric layer 320 such as PECVD silicon nitride, aluminum oxide or cured polyimide with Cr adhesion layer is deposited and patterned.

Figure 3F:
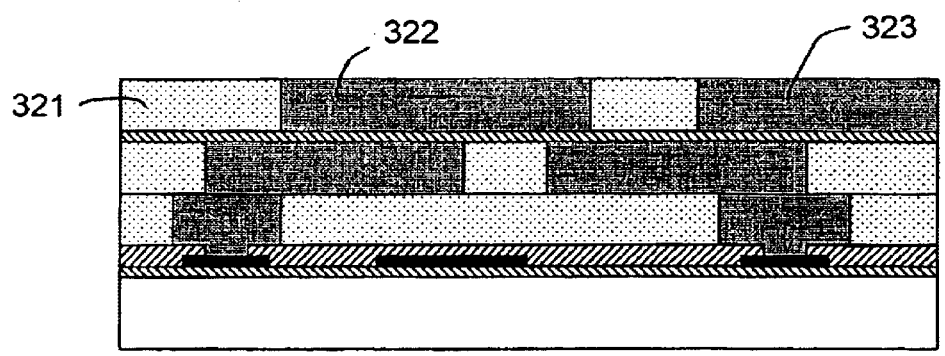

Referring to FIG. 3F, another application of the submodule forms the upper electrodes for the electrostatic actuators and gimbals for both out-of-plane rotational motions. Specifically, a seed layer (not shown) is sputter deposited. A thick layer of polymer 321 is deposited and patterned on top of the seed layer, then the structure is electroplated to form upper electrodes 322 and 323.

As will be readily apparent to those of ordinary skill in the art, the sub-module described in the preceding paragraph can be repeated to integrate the payload (such as mirrors) directly on top of the micro-actuators.

Figure 3G:
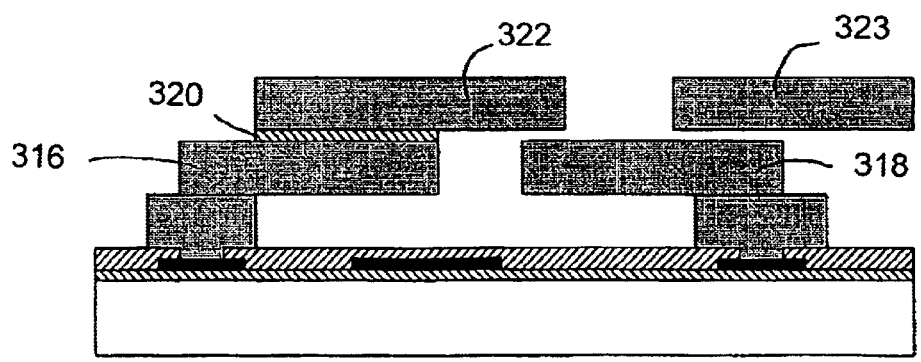

Finally, the structures are released by etch-removing the spacer layers and seed layers, leaving the structure as shown in FIG. 3G. In one embodiment, the upper electrode 322 corresponds to the driven electrodes 104b shown in FIG. 1 and/or structures connected electrically thereto; the portion of dielectric layer 320 remaining after the release process (FIG. 3G) corresponds to the electrical isolation layer 242 shown in FIG. 2; and lower electrode 316 corresponds to driving electrodes 108a and/or structures connected electrically thereto. Note that upper electrode 323 is connected to other upper electrode/body structures, e.g., the micro-actuator body, out of the plane shown in FIG. 3G.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. An electrostatically actuated MEMS device comprising:

an outer body portion mounted so as to have a first rotational degree of freedom about a first axis;

an inner body portion coupled mechanically to the outer body portion so as (1) to have a second rotational degree of freedom relative to said outer body portion about a second axis, said second axis being substantially perpendicular to said first axis and in the plane of said outer body portion, and (2) to rotate with the outer body portion about the first axis if said outer body is rotated about said first axis, such that said second axis remains substantially in the plane of said outer body portion as said outer body portion rotates about said first axis;

an outer electrostatic actuator configured to rotate said outer body portion about said first axis when an electrostatic force is applied to said outer electrostatic actuator; and an inner electrostatic actuator configured to rotate said inner body portion relative to said outer portion about said second axis when an electrostatic force is applied to said inner electrostatic actuator, wherein said outer body portion and said inner body portion are formed in two structural layers and said outer electrostatic actuator and said inner electrostatic actuator are formed in the same two structural layers as said out body portion and said inner body portion.

2. An electrostatically actuated MEMS device as recited in claim 1, wherein the structure by which the inner body portion is coupled mechanically to the outer body portion comprises a torsional spring, the torsional spring being configured to allow the inner body portion to be rotated about the second axis upon application of an actuation force sufficient to overcome the counteracting force of the torsional spring.

3. An electrostatically actuated MEMS device as recited in claim 1, wherein said outer body portion is mounted to a substrate using structures comprising a torsional spring, the torsional spring being configured to allow the outer body portion to be rotated about the first axis upon application of an actuation force sufficient to overcome the counteracting force of the torsional spring.

4. An electrostatically actuated MEMS device as recited in claim 1, wherein said outer body portion comprises a first segment connected mechanically and electrically to the inner body portion and a second segment connected mechanically to but isolated electrically from said first segment.

5. An electrostatically actuated MEMS device as recited in claim 4, wherein said first segment and the inner body portion comprise only structures formed in a first structural layer and said second segment comprises only structures formed in a second structural layer.

6. An electrostatically actuated MEMS device as recited in claim 5, wherein the first segment and the second segment are connected mechanically by a portion of non-conducting material formed between said first and second structural layers.

7. An electrostatically actuated MEMS device as recited in claim 1, wherein said outer electrostatic actuator comprises a first set of electrodes interdigitated with a second set of electrodes.

8. An electrostatically actuated MEMS device as recited in claim 7, wherein said first set of electrodes comprises a driven set of electrodes and said second set of electrodes comprises a driving set of electrodes configured such that the first set of electrodes are driven to move relative to the second set of electrodes upon application of a driving voltage to the second set of electrodes.

9. An electrostatically actuated MEMS device as recited in claim 8, wherein:

said outer body portion comprises a first segment connected mechanically and electrically to the inner body portion and a second segment connected mechanically to but isolated electrically from said first segment;

said first set of electrodes are connected physically and electrically to said first segment; and said second set of electrodes are mounted separately from the outer body portion, with the electrodes being interdigitated with said first set of electrodes.

10. An electrostatically actuated MEMS device as recited in claim 9, wherein:

said first segment is formed in a first structural layer; and said second set of electrodes are formed in a second structural layer;

whereby said first set of electrodes are offset from said second set of electrodes in the direction orthogonal to said first and second structural layers.

11. An electrostatically actuated MEMS device as recited in claim 9, wherein said first segment is connected electrically to a first electrical potential and said second set of electrodes are configured to be connected selectively to a variable electrical potential, the respective interdigitated electrodes of the first set of electrodes and the second set of electrodes being positioned such that the first set of electrodes are driven to move relative to the second set of electrodes upon selective application of a driving electrical potential to the second set of electrodes.

12. An electrostatically actuated MEMS device as recited in claim 11, wherein said first electrical potential is ground and said variable electrical potential may be applied selectively at a potential level sufficient to cause the outer body portion to rotate about the first axis by a desired amount.

13. An electrostatically actuated MEMS device as recited in claim 1, wherein said inner electrostatic actuator comprises a first set of electrodes interdigitated with a second set of electrodes.

14. An electrostatically actuated MEMS device as recited in claim 13, wherein said first set of electrodes comprises a driven set of electrodes and said second set of electrodes comprises a driving set of electrodes configured such that the first set of electrodes are driven to move relative to the second set of electrodes upon application of a driving voltage to the second set of electrodes.

15. An electrostatically actuated MEMS device as recited in claim 14, wherein:

said first set of electrodes are connected physically and electrically to the inner body portion; and said second set of electrodes are connected physically and electrically to a segment of the outer body portion that is isolated electrically from the inner body portion, with the electrodes being interdigitated with said first set of electrodes.

16. An electrostatically actuated MEMS device as recited in claim 15, wherein said first segment is connected electrically to a first electrical potential and said second set of electrodes are configured to be connected selectively to a variable electrical potential, the respective interdigitated electrodes of the first set of electrodes and the second set of electrodes being positioned such that the first set of electrodes are driven to move relative to the second set of electrodes upon selective application of a driving electrical potential to the second set of electrodes.

17. An electrostatically actuated MEMS device as recited in claim 16, wherein said first electrical potential is ground and said variable electrical potential may be applied selectively at a potential level sufficient to cause the outer body portion to rotate about the first axis by a desired amount.

18. An electrostatically actuated MEMS device as recited in claim 1, wherein said inner body portion is configured to have a payload mounted thereto.

19. An electrostatically actuated MEMS device as recited in claim 18, wherein the payload comprises a mirror.

20. An electrostatically actuated MEMS device as recited in claim 19, wherein the electrostatically actuated MEMS device comprises part of an optical switch.

21. An electrostatically actuated MEMS device as recited in claim 1, wherein said inner body portion is configured to have a payload formed thereon.

22. An electrostatically actuated MEMS device as recited in claim 1, wherein said inner body portion comprises a metal structure and is configured to have a payload formed of metal thereon.

23. An electrostatically actuated MEMS device as recited in claim 1, further comprising forming a mirror by electroplating a metal on the inner body portion machining.

* * * * *